US009806735B2

(12) United States Patent
Bagwe et al.

(10) Patent No.: US 9,806,735 B2
(45) Date of Patent: Oct. 31, 2017

(54) HIGH SPEED DATA TRANSFER FOR ANALOG-TO-DIGITAL CONVERTERS

(71) Applicant: Texas Instruments Incorporated, Dallas, TX (US)

(72) Inventors: Ameet Suresh Bagwe, Bangalore (IN); Kaustubh Ulhas Gadgil, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/846,491

(22) Filed: Sep. 4, 2015

(65) Prior Publication Data

US 2016/0204791 A1    Jul. 14, 2016

(30) Foreign Application Priority Data

Jan. 13, 2015    (IN) .............................. 197/CHE/2015

(51) Int. Cl.
| | | |
|---|---|---|
| *H03M 1/12* | (2006.01) | |
| *H03M 1/20* | (2006.01) | |
| *H03M 1/00* | (2006.01) | |
| *H03M 1/34* | (2006.01) | |
| *H03M 1/08* | (2006.01) | |

(52) U.S. Cl.
CPC ............. *H03M 1/20* (2013.01); *H03M 1/002* (2013.01); *H03M 1/0872* (2013.01); *H03M 1/34* (2013.01); *H03M 1/1245* (2013.01)

(58) Field of Classification Search
CPC ...... H03M 1/403; H03M 1/1057; H03M 1/12; H03M 1/0673; H03M 1/1215; H03M 1/146; H03M 1/468; H03M 1/002; H03M 1/1245; H03M 1/34; H03M 1/20
USPC .................................................. 341/118–160
See application file for complete search history.

(56) References Cited

U.S. PATENT DOCUMENTS

| | | | | |
|---|---|---|---|---|
| 6,636,084 | B2 * | 10/2003 | Sarraj .................. | G11C 27/026 327/95 |
| 7,250,892 | B2 * | 7/2007 | Weinstein .............. | H03M 1/12 331/154 |
| 7,782,235 | B1 * | 8/2010 | Velazquez ........... | H03M 1/1004 341/118 |
| 7,812,757 | B1 * | 10/2010 | Wong .................... | H03M 1/468 341/155 |

(Continued)

*Primary Examiner* — Lam T Mai
(74) *Attorney, Agent, or Firm* — Gregory J. Albin; Charles A. Brill; Frank D. Cimino

(57) ABSTRACT

This disclosure describes techniques for transferring data from an analog-to-digital converter (ADC) to a host device. The techniques may determine whether an ADC is operating in a quiet conversion time period, and selectively deactivate a digital data output of the ADC when the ADC is operating in the quiet conversion time period. This may allow an ADC to transfer data during both the conversion and acquisition phases of the ADC (rather than just during the acquisition phase), thereby increasing the data throughput of the ADC for a given transfer clock speed. The techniques may further allow data to be transferred during the conversion phase of an ADC without requiring a host device to be aware of the quiet conversion time period requirements of the ADC. In this way, the data throughput of an ADC data transfer may be increased with relatively little additional complexity added to a host device.

24 Claims, 7 Drawing Sheets

(56) References Cited

U.S. PATENT DOCUMENTS

| | | | | |
|---|---|---|---|---|
| 8,102,289 | B2* | 1/2012 | Oshima | H03M 1/1009 |
| | | | | 341/119 |
| 8,203,472 | B2* | 6/2012 | Robinson | H03M 1/0836 |
| | | | | 341/118 |
| 8,471,751 | B2* | 6/2013 | Wang | H03M 1/145 |
| | | | | 327/307 |
| 8,823,573 | B1* | 9/2014 | Nguyen | H03M 1/12 |
| | | | | 341/155 |
| 2005/0242980 | A1* | 11/2005 | Collins | G01B 31/318555 |
| | | | | 341/155 |
| 2009/0073018 | A1* | 3/2009 | Mitikiri | H03M 1/145 |
| | | | | 341/156 |
| 2010/0220000 | A1* | 9/2010 | Carreau | H03M 1/0673 |
| | | | | 341/155 |
| 2011/0043397 | A1* | 2/2011 | Carreau | H03M 1/0673 |
| | | | | 341/141 |
| 2013/0038477 | A1* | 2/2013 | Souchkov | H03M 1/1057 |
| | | | | 341/120 |

\* cited by examiner

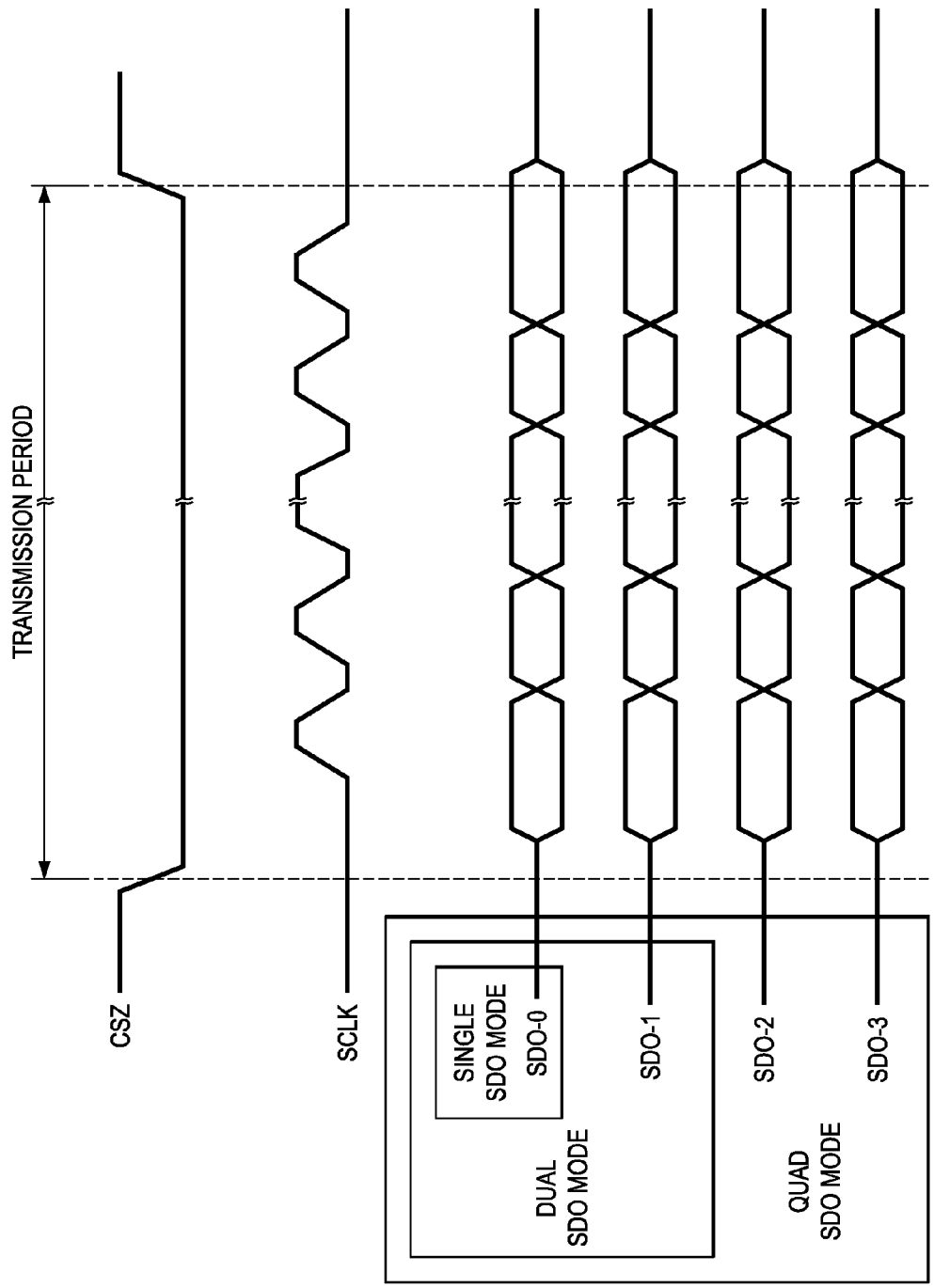

HIGH SPEED DATA TRANSFER FOR ANALOG-TO-DIGITAL CONVERTERS

This application claims priority under 35 U.S.C. §119 to Indian patent application 197/CHE/2015, filed Jan. 13, 2015, the entire content of which is incorporated herein by reference.

TECHNICAL FIELD

The disclosure relates to electrical circuits, and in particular to analog-to-digital converters.

BACKGROUND

Analog-to-digital converters (ADCs) may convert one or more analog input samples into one or more digital output words. An ADC may include an output interface configured to transfer resulting digital output words to a host device which may process the digital data. As the data converters reach higher and higher throughputs at higher and higher resolutions, the data transfer time window is shrinking and at the same time, the number of data bits is increasing.

SUMMARY

According to some aspects of this disclosure, an analog-to-digital converter (ADC) includes an analog input lead. The ADC further includes a digital output lead. The ADC further includes a conversion circuit having an analog input coupled to the analog input lead, and a digital output. The ADC further includes a quiet conversion time period determination circuit coupled to the conversion circuit. The quiet conversion time period determination circuit has a quiet conversion time period notification output. The ADC further includes an output circuit having a data input coupled to the digital output of the conversion circuit, a control input coupled to the quiet conversion time period notification output of the quiet conversion time period determination circuit, and a data output coupled to the digital output lead.

According to additional aspects of this disclosure, a method includes selectively activating and deactivating a digital data output of an ADC based on whether the ADC is operating in a quiet conversion time period.

According to additional aspects of this disclosure, a device includes circuitry configured to convert a first analog sample into a first digital data word. The circuitry is further configured to convert a second analog sample into a second digital data word. The circuitry is further configured to acquire a third analog sample for conversion into a third digital data word. The circuitry is further configured to, during conversion of the second analog sample into the second digital data word and during acquisition of the third analog sample, sequentially output groups of one or more bits of the first digital data word. The circuitry is further configured to, during conversion of the second analog sample into the second digital data word, determine whether the ADC is operating in a quiet conversion time period. The circuitry is further configured to, deactivate the digital data output in response to determining that the ADC is operating in the quiet conversion time period.

BRIEF DESCRIPTION OF THE DRAWINGS

FIG. 10 is a timing diagram illustrating example serial data output configurations for ADCs according to this disclosure.

DETAILED DESCRIPTION

Figure 1:
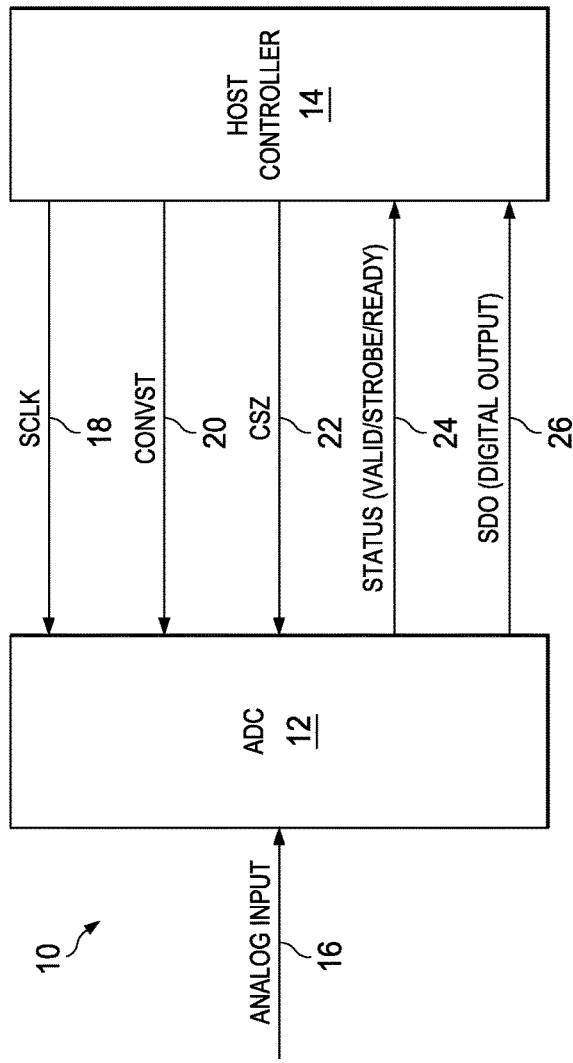
FIG. 1 is a block diagram illustrating an example analog-to-digital converter (ADC) system according to this disclosure.

This disclosure describes techniques for transferring data from an analog-to-digital converter (ADC) to a host device. The techniques may determine whether an ADC is operating in a quiet conversion time period, and selectively deactivate a digital data output of the ADC when the ADC is operating in the quiet conversion time period. This may allow an ADC to transfer data during both the conversion and acquisition phases of the ADC (rather than just during the acquisition phase), thereby increasing the data throughput of the ADC for a given transfer clock speed. The techniques may further allow data to be transferred during the conversion phase of an ADC without requiring a host device to be aware of and account for the quiet conversion time period requirements of the ADC. In this way, the data throughput of an ADC data transfer may be increased with relatively little additional complexity added to a host device.

An ADC may operate in an acquisition phase and a conversion phase. During the acquisition phase, the ADC may acquire a sample of the analog input signal (e.g., the ADC may charge one or more capacitors to charge values that are indicative of the magnitude of the analog input signal). During the transition between the acquisition and conversion phases, the ADC may sample the analog input signal to generate an analog sample. During the conversion phase, the ADC may convert the analog sample into a digital data word.

After generating the digital data word, the ADC may output the digital data word to a host device. One approach for transferring the digital data to the host device involves transferring the digital data from a previously-converted analog sample during the acquisition phase of a next analog sample. However, as ADCs reach higher and higher throughputs at higher and higher resolutions, the number of data bits to be transferred is increasing, and the data transfer time window available during the acquisition phase is often shrinking. Increasing the data transfer clock rate to compensate for the increased amount of data and smaller time frame may lead to several disadvantages including, for example: (1) reduced selection of host controllers that can be used in ADC-based systems, (2) increased the power consumption of ADC-based systems, and/or (3) lower input/output (I/O) supply voltages required for the ADC, thereby further limiting the choice of host controllers.

One approach for dealing with these issues is to allow an ADC to transfer a digital output word for a previously-converted analog sample during both the conversion phase of the next analog sample and the acquisition phase of the following analog sample. This may extend the time period during which a single digital data word may be transferred, thereby relaxing the minimum clock rate needed to transfer the data.

Toggling the digital data output during certain portions of the conversion phase of a subsequent analog sample, however, may cause errors in the conversion of the subsequent sample. The portions of the conversion phase where the conversion is susceptible to errors due to toggling of the digital data output may be referred to as a quiet conversion time period for the ADC. An ADC may specify that a host controller should not request data transfers from ADC during this time period in order to guarantee the reliability of the converted data.

For example, a successive approximation register (SAR) ADC may generate different bits of a single digital output data word at different times during the conversion phase. More specifically, a SAR ADC may generate the bits of a digital output word in order of significance of the bits starting with the most significant bit and ending with the least significant bit. During the generation of the lower-order bits, the conversion circuitry may be susceptible to errors due to the toggling of the serial data output and/or other outputs of the ADC.

A host controller may initiate the transfer of a digital data word from the ADC to the host controller by asserting one or more signals that effectively request that the ADC output one or more bits via a serial data output. When transferring data from an ADC during both the conversion and acquisition phases of the ADC, a host controller may avoid the quiet conversion time periods by subdividing a digital data word into a first set of bits and a second set of bits, requesting transfer of the first set of bits during the conversion phase, not requesting the transfer of any bits during the quiet conversion time period, and requesting transfer of the second set of bits during the following acquisition phase. However, such a scheme adds considerable complexity to the host controller, particularly in situations where clock rates may change from one application to the next, thus causing the host controller to have to recalculate the number of bits that are converted during each of the conversion and acquisition phases.

According to this disclosure, an ADC may determine whether the ADC is operating in a quiet conversion time period, and selectively deactivate a digital data output of the ADC when the ADC is operating in the quiet conversion time period. This may allow an ADC to transfer data during both the conversion and acquisition phases of the ADC without requiring a host device to be aware of and account for the quiet conversion time period requirements of the ADC. In this way, the data throughput of an ADC-based data transfer may be increased with relatively little additional complexity added to the host controller.

As used herein, a digital data word may refer to a complete set of bits that represents the value of a single analog sample. The digital data output of an ADC designed in accordance with this disclosure may include one or more output pins. The number of output pins may be less than the number of bits in the digital data word. An ADC may transfer a digital data word corresponding to a single analog sample to a host controller by successively outputting bits of the digital data word via the output pins. A group of one or more bits that are output by the ADC output pins at a single instance in time may be referred to as a serial data output word. In order for an ADC to transfer a digital data output word corresponding to a single analog sample to a host controller, the ADC may successively transfer a plurality of serial data output words to the host controller where the number of bits in each of the serial data output words is less than the number of bits in the digital data output word. The number of bits in a serial output data word (and the corresponding number of output pins) for an ADC may be equal to any integer greater than or equal to one.

In some examples, an ADC may receive an external data transfer clock signal from a host controller, and control the output of digital data based on the received clock signal. In such examples, when the digital data output is activated, the ADC may output one or more serial data output words for each clock cycle of the clock signal. When the digital data output is deactivated, the ADC may freeze the digital data output (i.e., maintain a substantially constant digital data output) for each clock cycle of the clock signal, thereby preventing the toggling of the digital data output and the consequent risk of conversion errors.

In examples where the ADC controls the output of digital data based on a clock signal received from a host controller, the ADC may generate an activation status output signal (or valid signal) that indicates whether the digital data output is activated (i.e., whether the signals carried by the digital data output are valid signals). In some examples, the ADC may toggle the activation status output signal one or more times for each successive clock cycle during clock cycles in which the digital data output is activated, and maintain the activation status output signal at a substantially constant value during clock cycles in which the digital data output is deactivated.

The host device may use the activation status output signal to determine whether to clock the data received from the digital data output of the ADC into one or more sequential circuit elements of the host device during a particular clock cycle. Generating an activation status output signal that indicates the clock cycles during which the digital data output carries valid signals may free the host controller from having to determine when to suspend the requesting of data bits due to quiet conversion time periods of the ADC. In this way, data transfers may be avoided during quiet conversion time periods of the ADC without requiring large amounts of complexity to be added to the host controller data requesting mechanism.

In examples where the ADC controls the output of digital data based on a clock signal from a host controller, the ADC may, in some examples, output a single serial data output word (e.g., one bit per digital output pin) via the digital data output for each complete cycle of the clock signal. In further examples, the ADC may output two serial data output words (e.g., two bits per digital output pin) for each complete cycle of the clock—one serial data output word for each half cycle or transition of the clock signal. Outputting two serial data output words for each complete clock cycle may increase the data transfer throughput of the ADC without requiring an increase in the frequency of the clock signal and/or may allow the minimum frequency required for the clock signal to be relaxed or reduced.

In examples where the ADC generates an activation status output signal, the ADC may, in some examples, use the activation status output to signal to the host controller that the digital data output is inactive when the ADC is operating in a quiet conversion time period. Signaling that the digital data output is inactive may prevent the host controller from latching invalid data from the digital data output when the digital data output is deactivated during the quiet conversion time period.

In some examples, the validity of the data is signaled by a toggle on the activation status output signal instead of using either a logic one level or a logic zero level. This may allow the time period outside of the quiet period to be used for transferring data. If a single logic level (i.e., a logic one level or a logic zero level) is used to signal activation, the valid signal may need to be brought to its inactive state before the quiet period begins, resulting in a loss of an extra transfer clock cycle. Using a toggle to signal the validity of the data, permits the last bit to be transmitted just before the quiet window starts as the signal can continue to hold its state through the quiet window.

In further examples, an ADC may generate an output strobe signal that toggles one or more times for each successive serial data output word that is output via the digital data output. In such examples, when the digital data output is activated, the ADC may output one or more serial data output words via the digital data output for each cycle of the strobe signal. When the digital data output is deactivated, the ADC may freeze the digital data output (i.e., maintain a substantially constant digital data output), thereby preventing the toggling of the digital data output and the consequent risk of conversion errors.

In examples where the ADC generates an output strobe signal, the timing of the strobe and digital data output may be aligned. The host device may use the output strobe signal to clock the data received from the digital data output of the ADC into one or more sequential circuit elements of the host device. Generating an output strobe signal that has successive transitions which are aligned to successive serial data output words may free the data transfer clocking rate of the ADC from being restricted by the minimum round-trip signal propagation time between the host device and ADC, thereby allowing the clocking rate of, and consequently data throughput of, an ADC-based data transfer to be increased. Moreover, using an output strobe signal that is aligned to the serial data output words may allow longer traces to be used on a printed circuit board (PCB) and/or allow an ADC to be placed further away from the host on the PCB, thereby relaxing the routing constraints of a PCB and, in general, easing the cost and complexity of a board design.

In examples where the ADC generates an output strobe signal, the ADC may, in some examples, output a single serial data output word for each complete cycle of the output strobe signal via the digital data output. In further examples, the ADC may output two serial data output words for each complete cycle of the output strobe signal—one serial data output word for each half cycle or transition of the strobe signal. Outputting two serial data output words for each complete cycle of the strobe signal may increase the data transfer throughput of the ADC without requiring an increase in the frequency of the strobe signal.

In examples where the ADC generates an output strobe signal, the ADC may, in some examples, selectively deactivate the output strobe signal when the ADC is operating in a quiet conversion time period. Deactivating the output strobe signal may correspond to causing the strobe signal to remain substantially constant and to not transition from one logic state to another. Deactivating the output strobe signal in this manner may prevent the host controller from latching invalid data from the digital data output during the quiet conversion time period.

In examples where an ADC generates an output strobe signal, the ADC may, in some examples, selectively deactivate a digital data output of an ADC when the ADC is operating in a quiet conversion time period. This may allow an ADC to transfer data during both the conversion and acquisition phases of the ADC without requiring a host device to be aware of and account for the quiet conversion time period requirements of the ADC. Allowing an ADC to transfer data during both the conversion and acquisition phases of the ADC may widen the time window during which data may be transferred, thereby relaxing the minimum frequency requirements of the output strobe signal. In this way, the frequency of output strobe signal may be reduced with relatively little additional complexity added to the host controller.

FIG. 1 is a block diagram illustrating an example analog-to-digital converter (ADC) system 10 according to this disclosure. ADC system 10 includes an ADC 12, a host controller 14, leads 16, 18, 20, 22, 24, and serial data output (SDO) connection 26. ADC 12 is coupled to host controller 14 via one or more of leads 18, 20, 22, 24. SDO connection 26 may include one or more leads coupled between ADC 12 and host controller 14. In some examples, each of the leads in SDO connection 26 may be a single-ended lead that carries a single-ended signal. In further examples, each of the leads in SDO connection 26 may be paired with another lead to form a differential pair of leads that carry a differential signal.

ADC 12 is configured to receive an analog input signal via analog input lead 16, convert samples of the analog signal into digital data words, and output the digital data words via SDO connection 26. In some examples, ADC 12 may be a successive approximation register (SAR) ADC.

Host controller 14 is configured to control ADC 12 by initiating the sampling and conversion of analog samples, and by initiating the transfer of data from ADC 12 to host controller 14. Host controller 14 may receive digital data words representative of the analog samples from ADC 12 via SDO connection 26, and process the digital data words for a variety of purposes.

During operation, ADC 12 may initially operate in an acquisition phase. During the acquisition phase, ADC 12 may receive an analog input signal via analog input lead 16, and charge one or more capacitors in ADC 12 using the analog input signal.

Host controller 14 may initiate the sampling and conversion process in ADC 12 by asserting a conversion start control signal via conversion start (CONVST) lead 20. For example, host controller 14 may transition a signal carried by CONVST lead 20 from a low logic value to a high logic value to signal to ADC 12 to start the sampling and conversion process.

In response to receiving the conversion start control signal via CONVST lead 20, ADC 12 may transition to the conversion phase, sample the analog input signal (e.g., sample the charge stored on the internal capacitors due to the analog input signal) to generate a first analog sample, and convert the first analog sample to a first digital data word representative of the first analog sample. In some examples, ADC 12 may use a successive approximation register technique to convert analog samples into digital data words, where output data bits are generated in order of significance starting with the most significant bit and ending with the least significant bit.

After the conversion is complete, ADC 12 may assert a conversion complete signal (e.g., a READY signal) via STATUS lead 24. For example, ADC 12 may transition a signal carried by STATUS lead 24 from a high logic value to a low logic value to signal to host controller 14 that the conversion is complete. After the conversion is complete, ADC 12 may also transition to the acquisition phase to acquire a subsequent analog sample.

In response to receiving the conversion complete signal from ADC 12 via STATUS lead 24, host controller 14 may defer the transfer of the digital data word from ADC 12 to host controller 14 until after ADC 12 starts a subsequent conversion phase. While deferring the transfer of the digital data word, host controller 14 may initiate the sampling and conversion process for a subsequent analog sample by asserting the conversion start control signal via CONVST lead 20. In response to receiving the conversion start control signal, ADC 12 may transition to the conversion phase, sample the analog input signal to generate a second analog sample, and convert the second analog sample into a second digital data word. After the conversion is complete, ADC 12 may assert a conversion complete signal (e.g., a READY signal) via STATUS lead 24, and transition to the acquisition phase to acquire a third analog sample.

While ADC 12 is in the conversion phase for the second analog sample, host controller 14 may initiate the transfer of the first digital data word (representative of the first digital sample) from ADC 12 to host controller 14 by asserting a chip select signal via chip select (CSZ) lead 22. For example, host controller 14 may transition a signal carried by CSZ lead 22 from a high logic value to a low logic value to signal to ADC 12 to initiate the data transfer.

In response to receiving the chip select signal, ADC 12 may serially transfer the first digital data word from ADC 12 to host controller 14 via SDO connection 26. ADC 12 may serially transfer a first portion of the first digital data word during the conversion phase for the second analog sample, and serially transfer a second portion of the first digital data word during the acquisition phase for the third analog sample.

Serially transferring a data digital data word from ADC 12 to host controller 14 may involve transferring the digital data word in groups of one or more bits via SDO connection 26. A group of one or more bits that is transferred from ADC 12 to host controller 14 via SDO connection 26 at a single instance in time may be referred to as a serial data output word. In other words, to transfer a digital data output word to host controller 14 via SDO connection 26, ADC 12 may successively transfer a plurality of serial data output words to host controller 14 via SDO connection 26 where the number of bits in each of the serial data output words is less than the number of bits in the digital data output word.

In some examples, SDO connection 26 may be a single wire, and ADC 12 may successively transfer serial data output words that have a size of one bit to host controller 14 via the single wire. In further examples, SDO connection 26 may include two wires, and ADC 12 may successively transfer serial data output words that have a size of two bits (one bit for each wire) to host controller 14 via the two wires. Other sizes of serial data output words and other numbers of wires for SDO connection 26 may also be used. In some examples, ADC 12 may have a fixed number of SDO output leads that can be selectively activated to generate SDO connections 26 of varying bit widths.

In response to receiving a serial data output word from ADC 12 via SDO connection 26, host controller 14 may store the serial data output word for further processing. For example, host controller 14 may latch the serial data output word in one or more sequential circuit elements.

Figure 2:
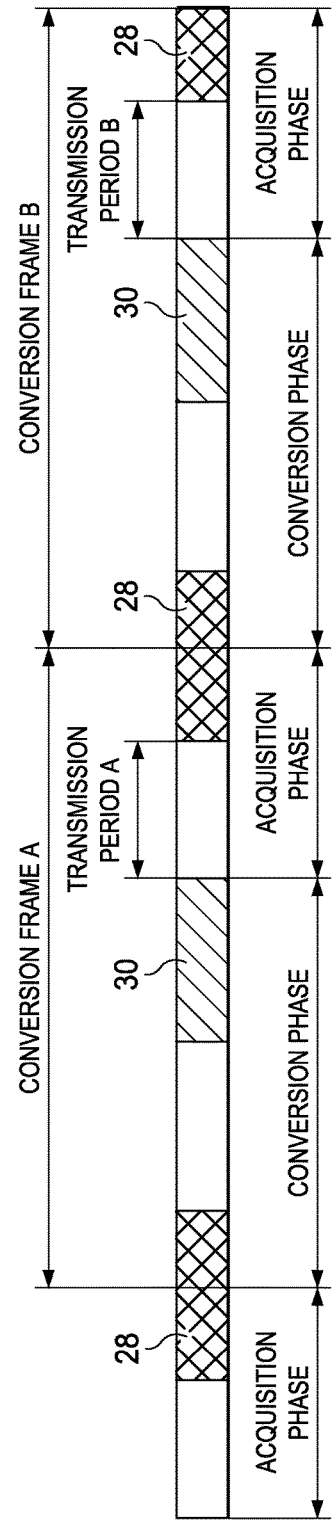
FIGS. 2 and 3 are conceptual diagrams illustrating timing aspects for example ADCs according to this disclosure.

FIG. 2 is a conceptual diagram illustrating example timing aspects for an example ADC that does not use the techniques of this disclosure. The diagram in FIG. 2 illustrates an initial acquisition phase followed by a first conversion frame ("conversion frame A") followed by a second conversion frame ("conversion frame B"). Each of the conversion frames is subdivided into a conversion phase followed by an acquisition phase.

The ADC may begin in an acquisition phase. During the acquisition phase, the ADC may acquire a sample of the analog input signal (e.g., by charging up one or more capacitors). The beginning of the conversion phase may be initiated by the host controller. For example, the ADC may transition from the acquisition phase to the conversion phase in response to receiving a conversion start signal from the host controller. During the transition between the acquisition and conversion phases, the ADC may sample the analog input signal to generate an analog sample. During the conversion phase, the ADC may convert the analog sample into a digital data word. After the conversion phase, the ADC may return to the acquisition phase to acquire a sample for the next conversion frame.

The diagram in FIG. 2 includes quiet acquisition time periods 28 and quiet conversion time periods 30. Quiet acquisition time periods 28 begin towards the end of the acquisition phase, and end towards the beginning of the conversion phase. Quiet conversion time periods 30 begin towards the later part of the conversion phase and end at the end of the conversion phase.

During the initial acquisition phase, the ADC acquires the analog input signal for a first analog sample. During conversion frame A, samples the analog input signal to obtain the first analog sample, converts the first analog sample to a first digital data word, and acquires the analog input signal for a second analog sample. During conversion frame B, the ADC samples the analog input signal to obtain a second analog sample, converts the second analog sample to a second digital data word, and acquires the analog input signal for subsequent sampling.

During the acquisition phase of conversion frame A, the ADC transfers the first digital data word generated during the conversion phase of conversion frame A to the host controller. The ADC transfers the first digital data word during portions of the acquisition phase that are not taken up by the quiet acquisition time period so as not to toggle the serial data output during this time period. The time period during which the ADC transfers the digital data word generated during conversion frame A may be referred to as transmission period A. Similarly, during the acquisition phase of conversion frame B, the ADC transfers the second digital data word generated during the conversion phase of conversion frame B to the host controller.

The ADC may output a single digital data word over multiple output cycles during a given transmission period. The amount of time for transferring each serial data output word during the transmission period may decrease as the throughput and resolution requirements of an ADC increase.

Figure 3:
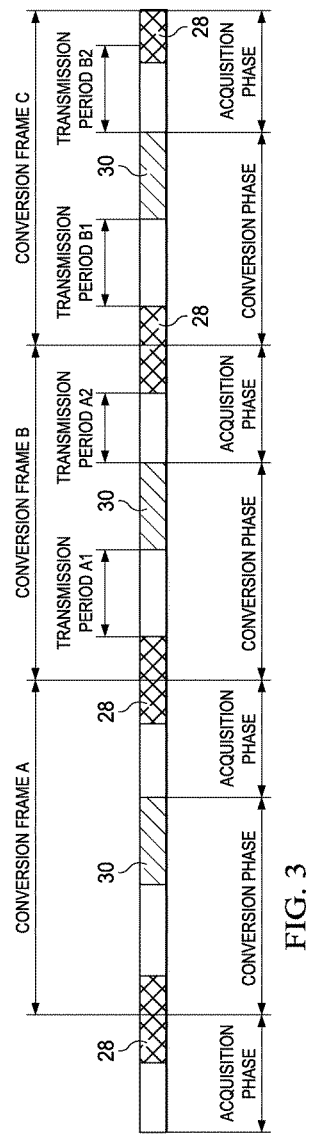

FIG. 3 is a conceptual diagram illustrating example timing aspects for an example ADC that implements the techniques of this disclosure. Similar to FIG. 2, the diagram in FIG. 3 illustrates an initial acquisition phase followed by a first conversion frame ("conversion frame A"), followed by a second conversion frame ("conversion frame B"), followed by a third conversion frame ("conversion frame C"). Each of the conversion frames is subdivided into a conversion phase and an acquisition phase. Each of the conversion frames also includes quiet acquisition time periods 28 and quiet conversion time periods 30.

The ADC may begin in an acquisition phase. The beginning of each conversion frame may be initiated by the host controller. During each of the conversion frames, ADC 12 samples the analog input signal to generate a respective analog sample, converts the respective analog sample to a respective digital data word, and acquires the analog input signal for subsequent sampling. During conversion frame A, ADC 12 generates a first digital data word. As shown in FIG. 3, ADC 12 transfers a portion of the first digital data word to host controller 14 during the conversion phase of conversion frame B (i.e., "transmission period A1") and a second portion of the first digital data word to host controller 14 during the acquisition phase of conversion frame B (i.e., "transmission period A2"). This effectively extends the time window over which the digital data word may be transmitted, thereby relaxing the rate at which each serial data output word needs to be transmitted.

As shown in FIG. 3, the transmission period for the first digital data word may not include the quiet conversion time period of the conversion phase of conversion frame B. This is because toggling the digital data output during this period may cause errors in the digital data word being generated in conversion frame B.

According to this disclosure, to avoid transmitting serial data output words during the quiet conversion time periods, ADC 12 may determine whether ADC 12 is operating in a quiet conversion time period, and selectively activate and deactivate a digital data output of ADC 12 (e.g., the output coupled to SDO connection 26) based on whether ADC 12 is operating in the quiet conversion time period. Specifically, ADC 12 may selectively deactivate the digital data output of ADC 12 when ADC 12 is operating in the quiet conversion time period. This may allow ADC 12 to transfer data during both the conversion and acquisition phases of the ADC without requiring host controller 14 to be aware of and account for the quiet conversion time period requirements of ADC 12. In this way, the data throughput of an ADC-based data transfer may be increased with relatively little additional complexity added to host controller 14.

Returning to FIG. 1, ADC 12 may signal to host controller 14 whether the digital data output of ADC 12 is activated or deactivated via a status output coupled to STATUS lead 24. In some examples, the status output may output a valid signal that indicates, for each clock cycle, whether the digital data output is activated (or whether the data is valid) for that clock cycle. In further examples, the status output may output a strobe signal that indicates when the digital data output is activated and new data has been output via the digital data output. The valid signal and the strobe signal may be used for different data transfer protocols as described in further detail below.

According to a first example data transfer protocol, host controller 14 may provide a serial data transfer clock signal to ADC 12 via SCLK lead 18, and ADC 12 may control the output of the digital data output based on the clock signal. ADC 12 may also generate a valid signal as part of the first example data transfer protocol, and output the valid signal via STATUS lead 24.

While ADC 12 is in the conversion phase, host controller 14 may initiate the transfer of a digital data word generated in a previous conversion frame from ADC 12 to host controller 14 by asserting a chip select signal via CSZ lead 22. In response to receiving the chip select signal, ADC 12 may wait for the clock signal carried by SCLK lead 18 to transition to a first clock cycle.

In response to the clock signal transitioning to the first clock cycle, ADC 12 may determine whether ADC 12 is operating in a quiet conversion time period. If ADC 12 is not operating in a quiet conversion time period, then ADC 12 may output a first serial data output word during the clock cycle via the digital data output, and signal that the digital data output is active during the current clock cycle via the valid signal carried by STATUS lead 24. The first serial data output word may correspond to a portion of the digital data output word that was converted in the previous conversion frame. Signaling that the digital data output is active may indicate to host controller 14 that the serial data output word for the current clock cycle is valid and should be latched.

If ADC 12 is operating in the quiet conversion time period, then ADC 12 may freeze the digital data output (i.e., cause the digital data output to remain at a constant logic value), and signal that the digital data output is inactive during the current clock cycle via the valid signal carried by STATUS lead 24. ADC 12 may freeze the digital data output to avoid toggling the digital data output during the quiet conversion time period. Signaling that the digital data output is inactive may indicate to host controller 14 that the serial data output word for the current clock cycle is invalid and should not be latched.

In some examples, to signal that digital data output is active, ADC 12 may toggle or invert the valid signal during the clock cycle. For example, if the valid signal was at a high logic level for a previous clock cycle, then ADC 12 may transition the valid signal to a low logic level during a subsequent clock cycle. Similarly, if the valid signal was at a low logic level for a previous clock cycle, then ADC 12 may transition the valid signal to a high logic level during a subsequent clock cycle. In such examples, to signal that the digital data output is inactive, ADC 12 may not toggle the valid signal during the clock cycle. In other examples, rather than toggling the valid signal, ADC 12 may use a first logic level to signal an active digital data output, and a second logic level to signal an inactive digital data output.

In response to the clock signal transitioning to the first clock cycle, host controller 14 may determine whether the digital data output of ADC 12 is active or inactive for the first clock cycle based on the valid signal carried by STATUS lead 24. For example, host controller 14 may determine whether the valid signal has toggled during the clock cycle, determine that the digital data output is active in response to determining that the valid signal has toggled during the clock cycle, and determine that the digital data output is inactive in response to determining that the valid signal has not toggled during the clock cycle.

In response to determining that the digital data output of ADC 12 is active for the current clock cycle, host controller 14 may latch the serial data output word carried by SDO connection 26 into one or more sequential circuit elements. In response to determining that the digital data output of ADC 12 is inactive for the current clock cycle, host controller 14 may not latch any data with the sequential circuit elements. In some examples, host controller 14 may use the same clock signal that is carried by SCLK lead 18 to latch the serial data output words. For example, host controller 14 may latch a serial data output word output during a current clock cycle in response to the clock signal transitioning to a subsequent clock cycle.

For each subsequent clock cycle of the clock signal carried by SCLK lead 18, ADC 12 may selectively activate and deactivate the digital data output based on whether ADC 12 is operating in a quiet conversion time period, and signal whether the digital data output is active via the valid signal carried by STATUS lead 24. ADC 12 may continue outputting serial data output words a valid signal until all of the serial data output words for a digital data output word have been transferred to host controller 14.

Automatically deactivating the digital data output during the quiet conversion time periods and signaling to host controller 14 when the digital data output is deactivated may free host controller 14 from having to determine when to suspend the requesting of data bits (e.g., when to suspend the SCLK signal) due to quiet conversion time periods of ADC 12. In this way, data transfers may occur during the conversion and acquisition phases of ADC 12 while avoiding transfers during quiet conversion time periods of the ADC and without requiring large amounts of complexity to be added to the data requesting mechanism of host controller 14.

According to a second example data transfer protocol, host controller 14 may provide a serial data transfer clock signal to ADC 12 via SCLK lead 18, and ADC 12 may control the output of the digital data output based on the clock signal. ADC 12 may also generate a valid signal as part of the second example data transfer protocol, and output the valid signal via STATUS lead 24. However, instead of outputting a single serial data output word per clock cycle as is done in the first example data transfer protocol, ADC 12 may output two serial data output words per clock cycle (e.g., one serial data output word per transition of the clock signal) as part of the second example data transfer protocol.

For example, in response to the clock signal transitioning to a first clock cycle, ADC 12 may determine whether ADC 12 is operating in a quiet conversion time period. If ADC 12 is not operating in a quiet conversion time period, then ADC 12 may output a first serial data output word during the clock cycle via the digital data output in response to a first type of transition in the clock signal, and output a second serial data output word during the clock cycle via the digital data output in response to a second type of transition in the clock cycle. The first and second types of transitions in the clock cycle may be different types of transitions that are either low-to-high transitions or high-to-low transitions. For example, if the first type of transition is a low-to-high transition, then the second type of transition may be a high-to-low transition. If ADC 12 is operating in the quiet conversion time period, then ADC 12 may freeze the digital data output (i.e., cause the digital data output to remain at a constant logic value).

ADC 12 may signal whether the digital data output is active during the clock cycle via the valid signal carried by STATUS lead 24 in a manner similar to that which was discussed above with respect to the first example data transfer protocol. For example, ADC 12 may toggle the valid signal during clock cycles in which the digital data output is active, and keep the valid signal at a constant logic level during clock cycles in which the digital data output is inactive. Because the valid signal is toggled on a clock cycle-by-clock cycle basis, the valid signal may be toggled for every other serial data output word that is output via the digital data output rather than for every serial data output word as occurred in the first example data transfer protocol.

In the second example data transfer protocol, ADC 12 may output two serial data output words for each complete cycle of the clock signal via the digital data output—one serial data output word for each half cycle or transition of the clock signal. Outputting two serial data output words for each complete clock cycle may increase the data transfer throughput of ADC system 10 without requiring an increase in the frequency of the clock signal.

According to a third example data transfer protocol, host controller 14 may generate an output strobe signal that toggles twice for each successive serial data output word that is output via the digital data output. ADC 12 may output the output strobe signal via STATUS lead 24. Host controller 14 may use the output strobe signal to clock the data received from the digital data output of ADC 12 into one or more sequential circuit elements of host controller 14.

While ADC 12 is in the conversion phase, host controller 14 may initiate the transfer of a digital data word generated in a previous conversion frame from ADC 12 to host controller 14 by asserting a chip select signal via CSZ lead 22. In response to receiving the chip select signal, ADC 12 may determine whether ADC 12 is operating in a quiet conversion time period. If ADC 12 is not operating in a quiet conversion time period, then ADC 12 may output a first serial data output word via the digital data output, and toggle the output strobe signal twice. The first serial data output word may correspond to a portion of the digital data output word that was converted in the previous conversion frame. Toggling the output strobe signal twice may signal to host controller 14 that the digital data output is active and should be latched. One or both of the transitions in the output strobe signal may indicate when host controller 14 should latch the data.

If ADC 12 is operating in the quiet conversion time period, then ADC 12 may freeze the digital data output (i.e., cause the digital data output to remain at a constant logic value), and freeze the output strobe signal (i.e., cause the output strobe signal to remain at a constant logic value). ADC 12 may freeze the digital data output to avoid toggling the digital data output during the quiet conversion time period. ADC 12 may freeze the output data strobe to indicate that the digital data output is inactive and/or that there is no data to be latched at the current instance in time.

In response to sending the chip select signal to ADC 12 via CSZ lead 22, host controller 14 may determine when to latch a serial data output word carried by SDO connection 26 into one or more sequential elements based on the output strobe signal. For example, host controller 14 may detect whether a particular type of transition has occurred in the output strobe signal (e.g., a low-to-high transition or a high-to-low transition), and latch the serial data output word carried by SDO connection 26 in response to detecting the particular type of transition in the output strobe signal. In response to not detecting the particular type of transition in the output strobe signal, host controller 14 may not latch any data in the sequential circuit elements.

For each subsequent serial data output word corresponding to the digital data word, ADC 12 may selectively activate and deactivate the digital data output based on whether ADC 12 is operating in a quiet conversion time period, and selectively toggle or not toggle the serial strobe output. ADC 12 may continue outputting serial data output words via SDO connection 26 until all of the serial data output words for a digital data output word have been transferred to host controller 14.

Automatically deactivating the digital data output during the quiet conversion time periods and freezing the output strobe signal carried by STATUS lead 24 when the digital data output is deactivated may free host controller 14 from having to determine when to suspend the requesting of data bits due to quiet conversion time periods of ADC 12. In this way, data transfers may occur during the conversion and acquisition phases of ADC 12 while avoiding transfers during quiet conversion time periods of the ADC and without requiring large amounts of complexity to be added to the data requesting mechanism of host controller 14.

Moreover, generating an output strobe signal that has successive transitions which are aligned to successive serial data output words may free the data transfer clocking rate of ADC 12 from being restricted by the minimum round-trip signal propagation time between host controller 14 and ADC 12, thereby allowing the clocking rate of, and consequently data throughput of, an ADC-based data transfer to be increased.

In some examples, host controller 14 may not send a clock signal to ADC 12. Instead, the output strobe signal carried via STATUS lead 24 may serve as a clocking signal for timing the latching of the data in host controller 14. In such examples, SCLK lead 18 may be omitted from ADC system 10.

In some examples, ADC 12 may include an internal clock generator that generates a clock signal at a particular frequency, and ADC 12 may generate the output strobe signal based on the internally-generated clock signal. In further examples, ADC 12 may receive an externally-generated clock signal, and generate the output strobe signal based on the externally-generated clock signal. In such examples, the externally-generated clock signal may, in some examples, be a clock signal received from host controller 14 via SCLK lead 18 (e.g., ADC 12 may reflect the clock signal from host controller 14 to the strobe output when the digital data output is activated).

According to a fourth example data transfer protocol, instead of generating an output strobe signal that toggles twice for each successive data output word as is done in the third example data transfer protocol, host controller 14 may generate an output strobe signal that toggles once for each successive serial data output word that is output via the digital data output. ADC 12 may output the output strobe signal via STATUS lead 24. Host controller 14 may use the output strobe signal to clock the data received from the digital data output of ADC 12 into one or more sequential circuit elements of host controller 14.

While ADC 12 is in the conversion phase, host controller 14 may initiate the transfer of a digital data word generated in a previous conversion frame from ADC 12 to host controller 14 by asserting a chip select signal via CSZ lead 22. In response to receiving the chip select signal, ADC 12 may determine whether ADC 12 is operating in a quiet conversion time period. If ADC 12 is not operating in a quiet conversion time period, then ADC 12 may output a first serial data output word via the digital data output, toggle the output strobe signal once while outputting the first serial data output word, output a second serial data output word, and toggle the output strobe signal once while outputting the serial data output word. If ADC 12 is operating in the quiet conversion time period, then ADC 12 may freeze the digital data output (i.e., cause the digital data output to remain at a constant logic value), and freeze the output strobe signal (i.e., cause the output strobe signal to remain at a constant logic value).

In response to sending the chip select signal to ADC 12 via CSZ lead 22, host controller 14 may determine when to latch a serial data output word carried by SDO connection 26 into one or more sequential elements based on the output strobe signal. For example, host controller 14 may detect whether any type of transition has occurred in the output strobe signal (e.g., a low-to-high transition or a high-to-low transition), and latch the serial data output word carried by SDO connection 26 in response to detecting any type of transition in the output strobe signal. In response to not detecting any type of transition in the output strobe signal, host controller 14 may not latch any data in the sequential circuit elements.

For each subsequent serial data output word corresponding to the digital data word, ADC 12 may selectively activate and deactivate the digital data output based on whether ADC 12 is operating in a quiet conversion time period, and selectively toggle or not toggle the serial strobe output. ADC 12 may continue outputting serial data output words via SDO connection 26 until all of the serial data output words for a digital data output word have been transferred to host controller 14.

In the fourth example data transfer protocol, ADC 12 may output two serial data output words for each complete cycle of the output strobe signal via the digital data output. Outputting two serial data output words for each complete cycle of the strobe signal may increase the data transfer throughput of the ADC without requiring an increase in the frequency of the strobe signal.

According to a fifth example data transfer protocol, ADC 12 may output serial data output words via the digital data output irrespective of whether ADC 12 is operating in a quiet conversion time period. ADC 12 may generate an output strobe signal that toggles twice for each successive serial data output word that is output via the digital data output. Host controller 14 may use the output strobe signal to clock the data received from the digital data output of ADC 12 into one or more sequential circuit elements of host controller 14. In some examples, bits in each of the serial data output words may be output via single-ended leads.

According to a sixth example data transfer protocol, ADC 12 may output serial data output words via the digital data output irrespective of whether ADC 12 is operating in a quiet conversion time period. However, instead of generating an output strobe signal that toggles twice for each successive data output word as is done in the fifth example data transfer protocol, host controller 14 may generate an output strobe signal that toggles once for each successive serial data output word that is output via the digital data output. ADC 12 may output the output strobe signal via STATUS lead 24. Host controller 14 may use the output strobe signal to clock the data received from the digital data output of ADC 12 into one or more sequential circuit elements of host controller 14. In some examples, bits in each of the serial data output words may be output via single-ended leads.

In some examples, ADC 12 may be configurable to support multiple data transfer protocols. In such examples, a user and/or host controller may be able to select which data transfer protocol to use for a given implementation and/or data transfer.

Figure 4:
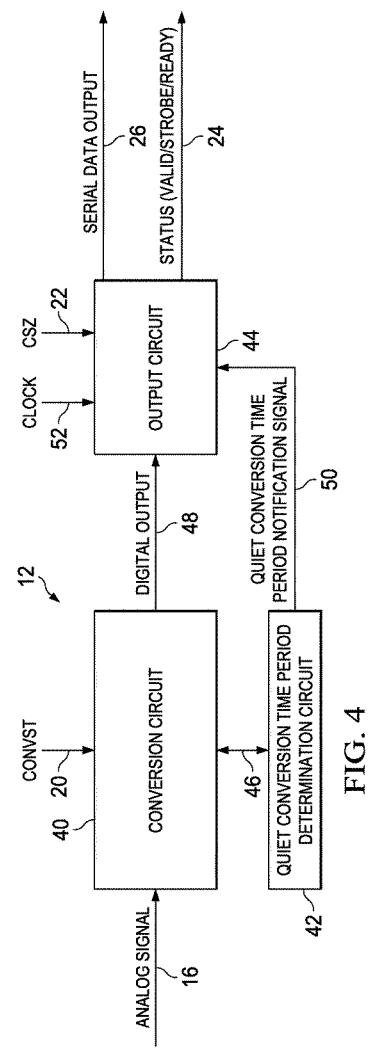
FIG. 4 is a block diagram illustrating an example ADC that may be used in the example ADC system of FIG. 1.

FIG. 4 is a block diagram illustrating an example ADC 12 that may be used in the ADC system 10 of FIG. 1. ADC 12 includes a conversion circuit 40, a quiet conversion time period determination circuit 42, an output circuit 44, connections 26, 46, and leads 16, 20, 22, 24, 48, 50, 52. Connections 26, 46 may each include one or more leads.

Analog input lead 16 forms an analog input of conversion circuit 40. CONVST lead 20 forms a control input of conversion circuit 40. A digital output of conversion circuit 40 is coupled to a digital input of output circuit 44 via lead 48. Conversion circuit 40 is coupled to quiet conversion time period determination circuit 42 via connection 46. An output of quiet conversion time period determination circuit 42 is coupled to a quiet zone control input of output circuit 44. CSZ lead 22 forms a chip select input of output circuit 44. Lead 52 forms a clock input for output circuit 44. SDO connection 26 forms a serial data output for output circuit 44. STATUS lead 24 forms a status output that may carry a valid signal, strobe signal, and/or ready signal.

During operation, conversion circuit 40 may initially operate in an acquisition phase during which conversion circuit 40 may receive an analog input signal via analog input lead 16. In response to receiving a conversion start control signal via CONVST lead 20, conversion circuit 40 may transition from the acquisition phase to the conversion phase, sample the analog input signal to generate an analog sample, convert the analog sample to a digital data word, and output the digital data word to output circuit 44 via lead 48.

Conversion circuit 40 may generate different bits for the digital data word at different times during the conversion. For example, conversion circuit 40 may use a successive approximation register technique to convert analog samples into digital data words, where output data bits are generated in order of significance starting with the most significant bit and ending with the least significant bit.

A quiet conversion time period may be specified for the period of time during which conversion circuit 40 is converting the lower-order bits. The quiet conversion time period may refer to a time period during which the toggling of the digital data output of ADC 12 (or another output of ADC 12) may corrupt the bits in the digital data word generated by conversion circuit 40 of ADC 12. In some examples, the quiet conversion time period may be specified by the manufacturer of an ADC.

In further examples, the quiet conversion time period may be a time period corresponding to when lower-order bits (e.g., lower-significant bits) of a digital data word are being converted. For example, the quiet conversion time period may correspond to the time period during which bits having an order (or significance) lower than a threshold order (or significance) are being converted. The threshold order (or significance) may be indicative of a specified order (or significance) for a bit below which the toggling of the data output lead may corrupt the conversion of the bit.

In additional examples, the quiet conversion time period may correspond to the remaining part of the conversion phase after a threshold amount of conversion time has elapsed. In further examples, the quiet conversion time period may correspond to the remaining part of the conversion phase after a threshold number of bits have been converted.

Quiet conversion time period determination circuit 42 may determine whether conversion circuit 40 (or ADC 12) is operating in the quiet conversion time period, generate a quiet conversion time period notification signal indicative of whether conversion circuit 40 (or ADC 12) is operating in the quiet conversion time period, and output the quiet conversion time period to output circuit 44 via lead 50.

In response to receiving a digital data word from conversion circuit 40 via lead 48, output circuit 44 may store the digital word until output circuit 44 receives a signal to initiate the transfer of data. Output circuit 44 may receive a data transfer initiation signal via CSZ lead 22.

In response to receiving a data transfer initiation signal via CSZ lead 22, output circuit 44 may initiate the transfer of a converted digital data word to an external device via SDO connection 26. While transferring the data, output circuit 44 may selectively activate and deactivate the serial data output in response to the quiet conversion time period notification signal. For example, output circuit 44 may deactivate the serial data output in response to the quiet conversion time period notification signal indicating that conversion circuit 40 is operating in the quiet conversion time period, and activate the serial data output in response to the quiet conversion time period notification signal indicating that conversion circuit 40 is not operating in the quiet conversion time period. Output circuit 44 may selectively activate and deactivate the serial data output using any of the techniques described in this disclosure. In this way, output circuit 44 may deactivate the serial data output during quiet conversion time periods.

In some examples, output circuit 44 may receive a clock signal via lead 52. Lead 52 may, in some examples, be coupled to an externally-generated clock signal (e.g., a clock signal carried by SCLK lead 18). In further examples, ADC 12 may include an internal clock generator, and lead 52 may be coupled to a clock output of the internal clock generator.

In some examples, output circuit 44 may receive a serial data transfer clock signal from host controller 14 via lead 52, and control the output of data based on the received clock signal. In such examples, output circuit 44 may output one or more serial data output words via SDO connection 26 for each clock cycle during which the serial data output is activated. In such examples, output circuit 44 may also output a valid signal that indicates whether the serial data output is activated for each clock cycle.

In further examples, output circuit 44 may generate a strobe signal, and output the strobe signal via STATUS lead 24. In such examples, output circuit 44 may, in some examples, receive an internally or externally generated clock signal, and generate the output strobe signal based on the clock signal. In such examples, output circuit 44 may selectively activate and deactivate the output strobe signal based on the quiet conversion time period notification signal. Output circuit 44 may output one or more serial data output words for each cycle of the output strobe signal carried by STATUS lead 24.

In some examples, to determine whether ADC 12 is operating in the quiet conversion time period, quiet conversion time period determination circuit 42 may determine whether a threshold amount of time has elapsed since a start of a conversion of an analog sample by conversion circuit 40. In response to determining that a threshold amount of time has elapsed since a start of a conversion of an analog sample and that ADC 12 has not finished the conversion of the analog sample, quiet conversion time period determination circuit 42 may determine that ADC 12 is operating in the quiet conversion time period. In response to determining that a threshold amount of time has not elapsed since the start of the conversion of the analog sample, quiet conversion time period determination circuit 42 may determine that ADC 12 is not operating in the quiet conversion time period.

In further examples, to determine whether ADC 12 is operating in the quiet conversion time period, quiet conversion time period determination circuit 42 may determine whether a threshold number of digital bits have been generated for an analog sample since a start of a conversion of the analog sample by conversion circuit 40. In response to determining that a threshold number of digital bits have been generated for an analog sample since a start of a conversion of the analog sample and that the ADC has not finished the conversion of the analog sample, quiet conversion time period determination circuit 42 may determine that ADC 12 is operating in the quiet conversion time period. In response to determining that the threshold number of digital bits has not been generated for the analog sample since the start of a conversion of the analog sample, quiet conversion time period determination circuit 42 may determine that ADC 12 is not operating in the quiet conversion time period.

In additional examples, to determine whether ADC 12 is operating in the quiet conversion time period, quiet conversion time period determination circuit 42 may determine whether ADC 12 is currently generating bits for an analog sample that have bit significances that are lower than a threshold bit significance. In response to determining that ADC 12 is currently generating bits for an analog sample that have bit significances that are lower than a threshold bit significance, quiet conversion time period determination circuit 42 may determine that ADC 12 is operating in the quiet conversion time period. In response to determining that ADC 12 is currently generating bits for the analog sample that have bit significances that are greater than the threshold bit significance, quiet conversion time period determination circuit 42 may determine that ADC 12 is not operating in the quiet conversion time period.

In some examples, the length of the quiet conversion time period may be configurable (e.g., user-configurable and/or vendor-configurable). In such examples, quiet conversion time period determination circuit 42 may receive one or more configuration parameters that specify the length of the quiet conversion time period, and determine whether the ADC is operating in the quiet conversion time period based on the length of the quiet conversion time period specified by the parameters. The parameters may specify one or more of a threshold time, a threshold number of bits, and/or a threshold bit significance that may be used in the above-described quiet zone determination techniques.

Decreasing the length of the quiet conversion time period may increase the amount of time allowed for transferring data (thereby relaxing the minimum clock/strobe frequency) at the expense of lowed ADC performance (e.g., lower signal-to-noise ratio). Increasing the length of the quiet conversion time period may have the opposite effect. By allowing the quiet conversion time period to be configurable, a vendor and/or user may be able to adjust the quiet conversion time period to balance ADC performance requirements against data transfer rate requirements for a particular application.

Figure 5:
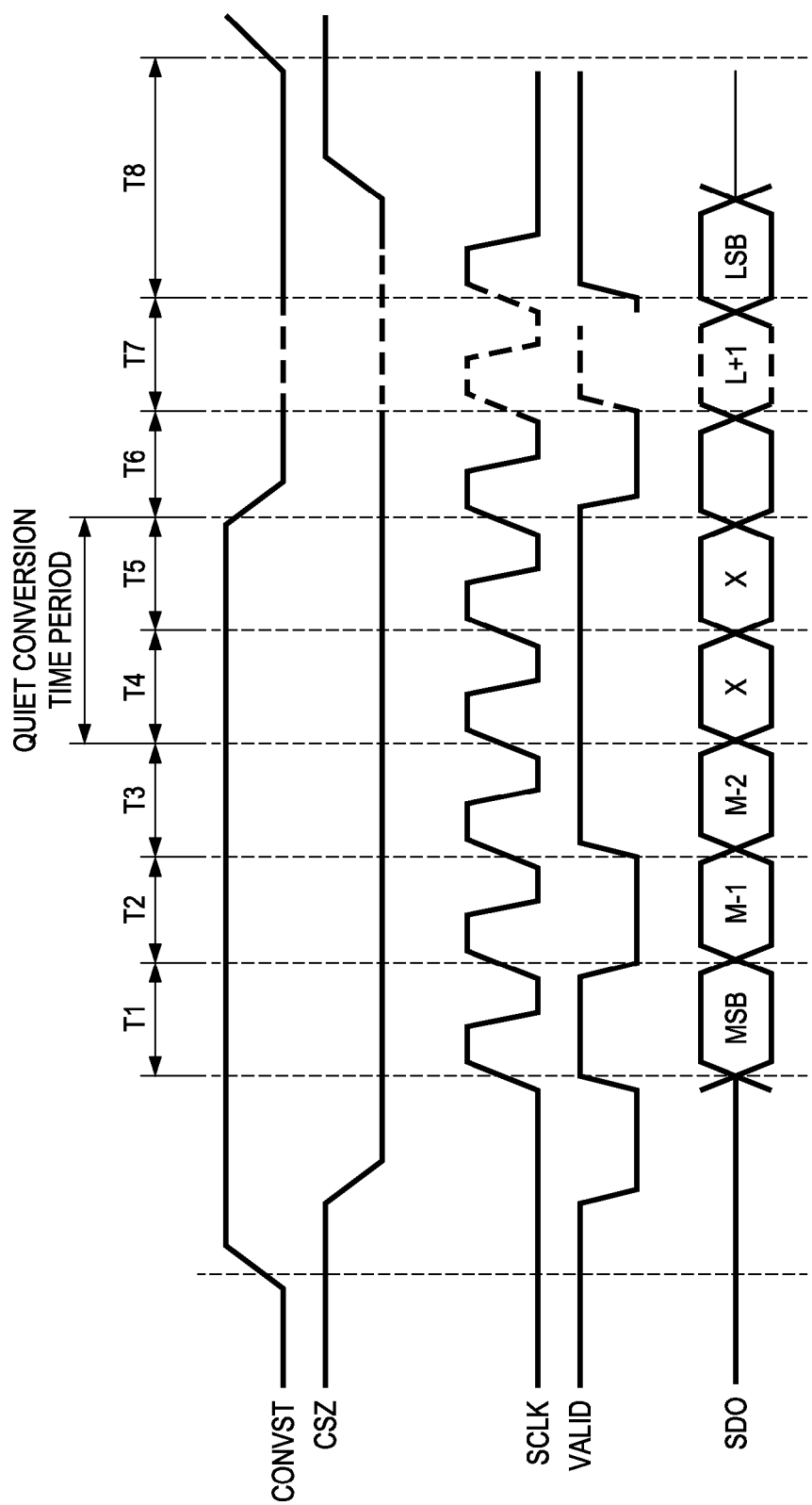
FIGS. 5-7 are timing diagrams illustrating example timing for example ADC data transfer protocols according to this disclosure.

FIG. 5 is a timing diagram illustrating example timing for the first example ADC data transfer protocol according to this disclosure. As shown in FIG. 5, host controller 14 initiates the conversion of data by asserting a conversion start signal via CONVST lead 20. After issuing the conversion start signal, host controller 14 initiates the beginning of a data transfer for a digital data word that was converted during a previous conversion phase by asserting a data transfer start signal via CSZ lead 22.

In response to receiving the data transfer start signal, ADC 12 toggles the signal carried by STATUS lead 24 to issue a ready signal indicating that ADC 12 is ready to begin transferring data. In response to receiving the ready signal, host controller 14 provides a serial data transfer clock signal to ADC 12 via SCLK lead 18.

During clock cycle T1, ADC 12 is operating in the conversion phase, and is not operating during a quiet conversion time period. Consequently, ADC 12 outputs the most significant serial data output word of the digital data word via SDO connection 26. ADC 12 also toggles the valid signal to indicate that the digital data output is active. Host controller 14 receives the serial data output word and the toggled valid signal, and latches the data into one or more sequential circuit elements.

During clock cycles T2 and T3, ADC 12 is still not operating in the quiet conversion time period. As such ADC 12 transfers additional serial data output words of decreasing significance to host controller 14, and toggles the valid signal for each clock cycle.

During clock cycles T4 and T5, ADC 12 is operating during the quiet conversion time period. Consequently, ADC 12 deactivates the digital data output carried by SDO connection 26 and freezes the valid signal carried by STATUS lead 24.

During clock cycles T6, T7, and T8, ADC 12 is operating in the acquisition phase, and proceeds to output the last three least-significant serial data output words. The ADC-based data transfer is now complete.

Figure 6:
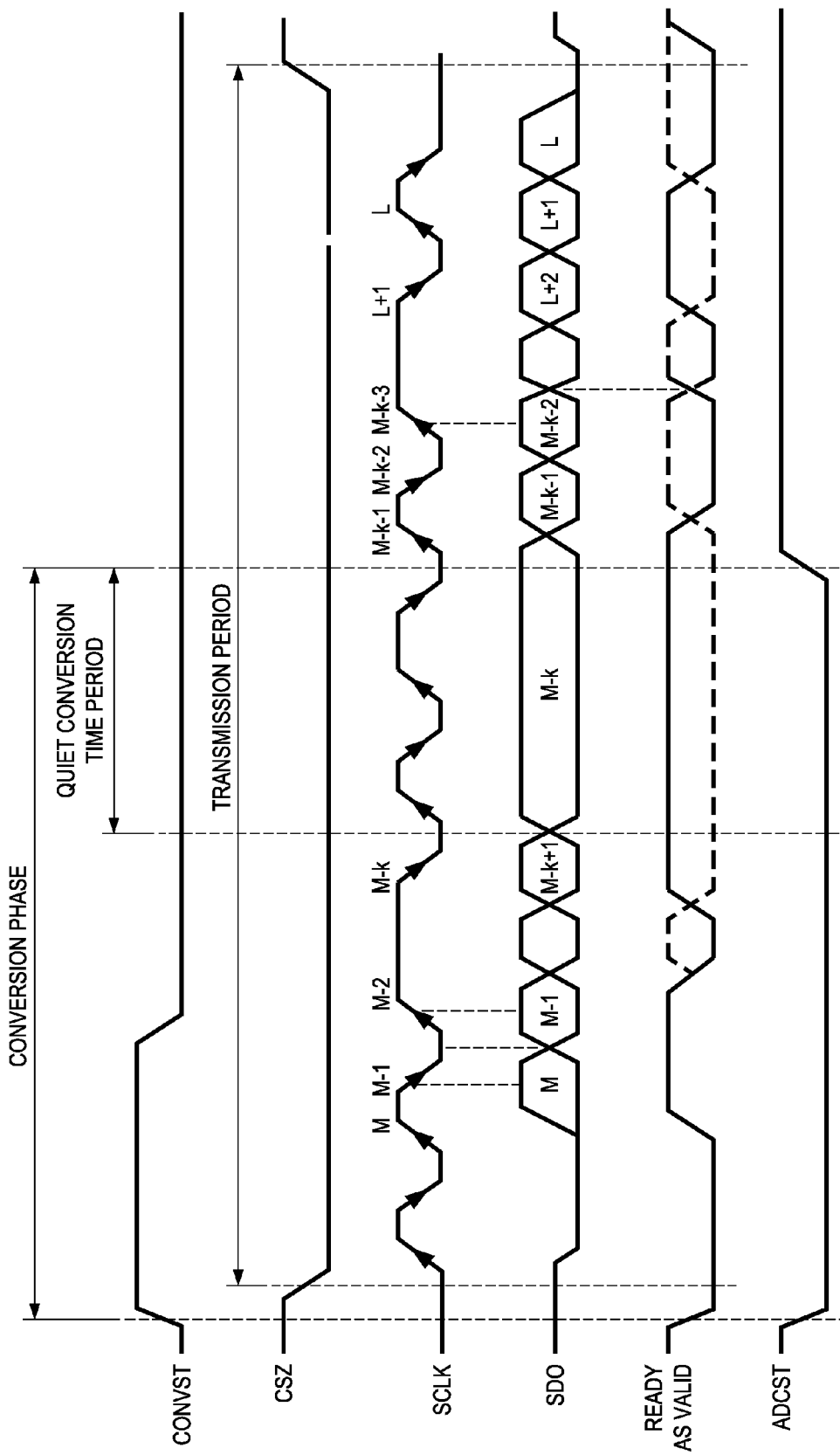

FIG. 6 is a timing diagram illustrating example timing for the second example ADC data transfer protocol according to this disclosure. The timing aspects depicted in FIG. 6 are similar to the timing aspects depicted in FIG. 5 except that two serial data output words are output for each clock cycle of the clock signal carried by SCLK lead 18. Specifically, ADC 12 outputs a first data output word (M) in response to the rising edge (M) of SCLK, and outputs a second data output word (M−1) in response to the falling edge (M) of SCLK. ADC 12 toggles the valid signal once per each clock cycle during which the digital data output is value. ADC 12 deactivates the digital data output and freezes the valid signal during the quiet conversion time period. The ADCST signal depicted in FIG. 6 represents the state of the conversion circuit of ADC 12 and roughly indicates when ADC 12 is operating in the conversion phase (logic 0) and the acquisition phase (logic 1).

Figure 7:
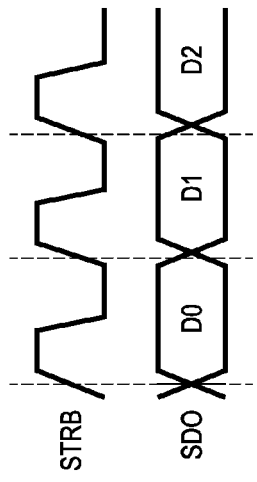

FIG. 7 is a timing diagram illustrating example timing for the third example ADC data transfer protocol according to this disclosure. As shown in FIG. 7, ADC 12 generates and outputs a strobe signal, and also outputs a single serial data output word for each cycle of the strobe signal. For the fourth example ADC data transfer protocol, ADC 12 may output two serial data output words for each cycle of the strobe signal.

Figure 8:
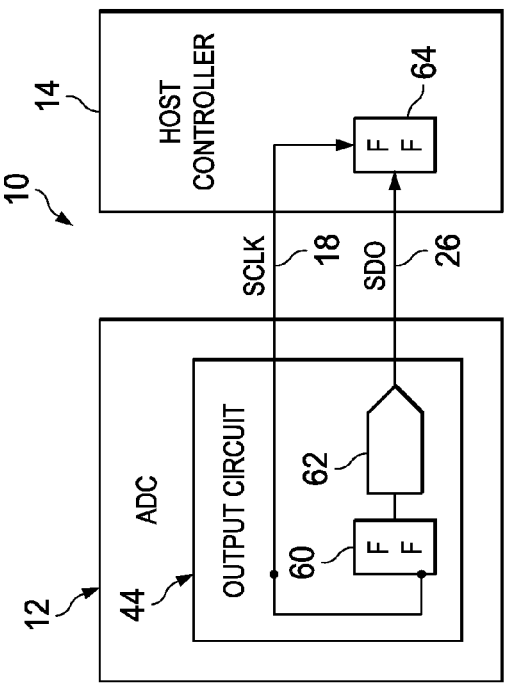

FIG. 8 is a block diagram illustrating example input and output circuits that may be used in ADC system 10 of FIG. 1. As shown in FIG. 8, ADC 12 includes an output circuit 44, which includes a sequential circuit element 60 and an output driver 62. Host controller 14 includes a sequential circuit element 64. Sequential circuit elements 60, 64 may be alternatively referred to as flip-flops (FFs). A clock input of sequential circuit element 60 is coupled to SCLK lead 18. A data input of sequential circuit element 60 is coupled to one or more bits of a digital output of a conversion circuit. A data output of sequential circuit element 60 is coupled to an input of output driver 62. An output of output driver 62 is coupled to SDO connection 26. A clock input of sequential circuit element 64 is coupled to SCLK lead 18. A data input of sequential circuit element 64 is coupled to SDO connection 26.

Although not shown in FIG. 8, output circuit 44 may, in some examples, also include another sequential circuit element having a clock input coupled to SCLK lead 18 and a data output coupled to STATUS lead 24. The additional sequential circuit element may output the valid signal. Host controller 14 may also have logic that is controlled by the valid signal to determine whether to clock data into sequential circuit element 64 and/or whether to accept the data that has been clocked into sequential circuit element 64 as valid data.

The ADC system 10 illustrated in FIG. 8 may be used to implement ADC systems that transfer data according to either of the first and second example data transfer protocols described in this disclosure. Because the output sequential circuit element 60 in ADC 12 and the input sequential circuit element 64 in host controller 14 are controlled by the same clock signal, the maximum data transfer rate for each serial data output word may be limited by the round-trip propagation delay between host controller 14 and ADC system 10.

Figure 9:
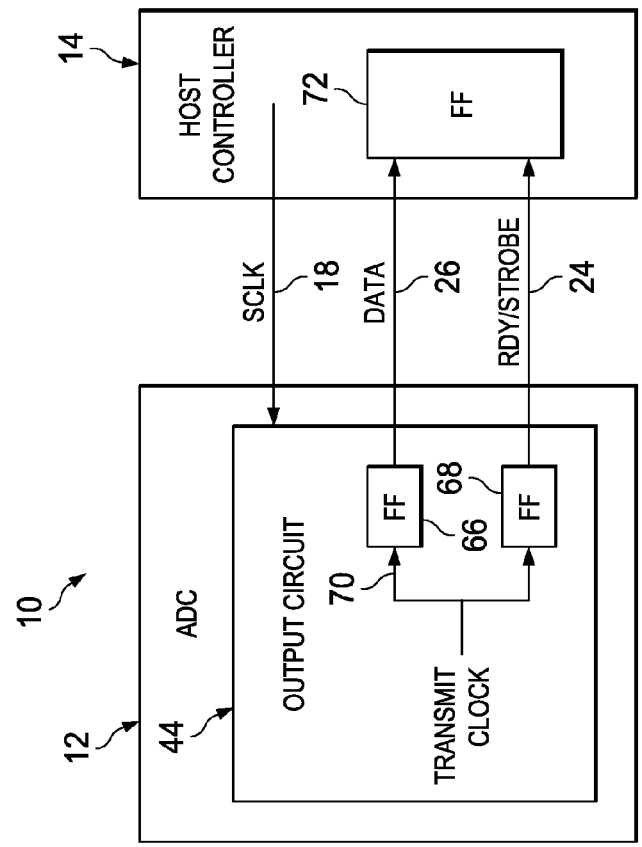
FIGS. 8 and 9 are block diagrams illustrating example input and output circuits that may be used in the ADC system in FIG. 1.

FIG. 9 is a block diagram illustrating example input and output circuits that may be used in ADC system 10 of FIG. 1. As shown in FIG. 9, ADC 12 includes an output circuit 44, which includes sequential circuit elements 66, 68 and lead 70. Host controller 14 includes a sequential circuit element 72. Sequential circuit elements 66, 68, 72 may be alternatively referred to as flip-flops (FFs). Clock inputs of sequential circuit elements 66, 68 are coupled to a transmit clock signal via lead 70. Lead 70 may be coupled to an internal and/or external clock source. In some examples, lead 70 may not be coupled to SCLK lead 18. In other words, the transmit clock signal in such examples may be generated independent of the clock signal carried on SCLK lead 18.

A data input of sequential circuit element 66 is coupled to one or more bits of a digital output of a conversion circuit. A data output of sequential circuit element 66 is coupled to SDO connection 26. A data output of sequential circuit element 68 is coupled to STATUS lead 24. Sequential circuit element 68 may be configured to toggle in response to a rising or falling edge of a transmit clock signal. A clock input of sequential circuit element 72 is coupled to STATUS lead 24. A data input of sequential circuit element 72 is coupled to SDO connection 26.

The ADC system 10 illustrated in FIG. 9 may be used to implement ADC systems that transfer data according to one or more of the third, fourth, fifth, and sixth data transfer protocols described in this disclosure. Generating an output strobe signal that has successive transitions which are aligned to successive serial data output words may free the data transfer clocking rate of ADC 12 from being restricted by the minimum round-trip signal propagation time between host controller 14 and ADC 12, thereby allowing the clocking rate of, and consequently data throughput of, an ADC-based data transfer to be increased.

FIG. 10 is a timing diagram illustrating example serial data output configurations for ADCs according to this disclosure. As shown in FIG. 10, ADC 12 may be configured or be configurable to operate in: (1) a single SDO mode in which SDO connection 26 includes a single serial data output lead to serially transfer a single bit at a time; (2) a dual SDO mode in which SDO connection 26 includes two serial data output leads to serially transfer two bits at a time; and (3) a quad SDO mode in which SDO connection 26 includes four serial data output leads to serially transfer four bits at a time.

Figure 11:
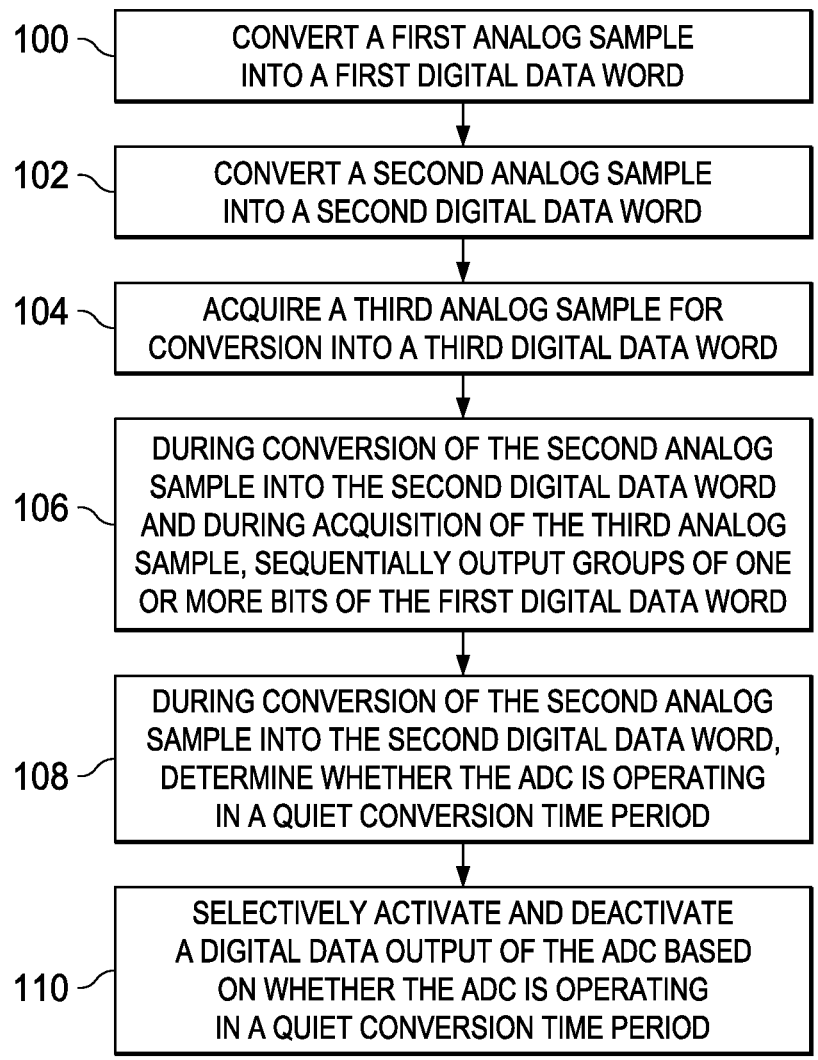
FIG. 11 is a flow diagram illustrating an example technique for transferring data from an ADC to a host controller according to this disclosure.

FIG. 11 is a flow diagram illustrating an example technique for transferring data from an ADC to a host controller according to this disclosure. ADC 12 converts a first analog sample into a first digital data word (100). ADC 12 converts a second analog sample into a second digital data word (102). ADC 12 acquires a third analog sample for conversion into a third digital data word (104). In other words, ADC 12 may operate in an acquisition phase that acquires the analog input signal for obtaining a third analog sample. During conversion of the second analog sample into the second digital data word and during acquisition of the third analog sample, ADC 12 sequentially outputs groups of one or more bits of the first digital data word (106). During conversion of the second analog sample into the second digital data word, ADC 12 determines whether the ADC is operating in a quiet conversion time period (108). ADC 12 selectively activates and deactivates a digital data output of ADC 12 based on whether ADC 12 is operating in a quiet conversion time period (110).

In some examples, to selectively activate and deactivate the digital data output, ADC 12 may determine whether the ADC is operating in the quiet conversion time period, deactivate the digital output in response to the determining that the ADC is operating in the quiet conversion time period, and activate the digital output in response to the determining that the ADC is not operating in the quiet conversion time period.

In some examples, ADC 12 may toggle an output strobe signal once per serial data output word that is output by the digital data output. In further examples, ADC 12 may toggle an output strobe signal twice per serial data output word that is output by the digital data output.

In additional examples, ADC 12 may activate toggling of an output strobe signal in response to activation of the digital data output, deactivate the toggling of the output strobe signal in response to deactivation of the digital data output, toggle the output strobe signal one or more times per serial data output word that is output by the digital data output in response to activating the output strobe signal, and maintain a substantially constant value for the output strobe signal in response to deactivating the output strobe signal.

In some examples, ADC 12 may receive a clock signal from an external device, output one serial data output word per clock cycle of the clock signal in response to activation of the digital data output, and toggle an output status signal once per clock cycle of the clock signal in response to outputting a serial data output word during the clock cycle.

In further examples, ADC 12 may receive a clock signal from an external device, output two serial data output words per clock cycle of the clock signal in response to activation of the digital data output, and toggle an output status signal once per clock cycle of the clock signal in response to activation of the digital data output.

In additional examples, ADC 12 may receive a clock signal from an external device, output one or more serial data output words during a clock cycle of the clock signal in response to the serial data output being activated during the clock cycle, toggle an output status signal during a clock cycle of the clock signal in response to outputting the serial data output words during the clock cycle, and maintain a substantially constant value for the output status signal in response to the serial data output being deactivated during the clock cycle.

As shown in FIG. 4, ADC 12 may include an analog input lead 16, and a digital output lead (e.g., SDO connection 26). ADC 12 may further include a conversion circuit 40 having an analog input coupled to analog input lead 16, and a digital output. ADC 12 may further include a quiet conversion time period determination circuit 42 coupled to conversion circuit 40. Quiet conversion time period determination circuit 42 may have a quiet conversion time period notification output. ADC 12 may further include an output circuit 44 having a data input coupled to the digital output of conversion circuit 40, a control input coupled to the quiet conversion time period notification output of quiet conversion time period determination circuit 42, and a data output coupled to the digital output lead.

In some examples, the digital output lead forms a digital output for ADC 12, and output circuit 44 is configured to selectively activate and deactivate the digital output based on whether ADC 12 is operating in the quiet conversion time period.

In further examples, ADC 12 further includes an input clock lead (e.g., SCLK lead 18) that is configured to receive a clock signal. In such examples, output circuit 44 may, in some examples, be further configured to, when the digital output is activated, output one serial data output word per clock cycle of the clock signal via the digital output lead. In additional examples, output circuit 44 may be further configured to, when the digital output is activated, output two serial data output words per clock cycle of the clock signal via the digital output lead.

In additional examples, ADC 12 includes an output activation status lead (e.g., STATUS lead 24) coupled to output circuit 444. In such examples, the output status lead forms an output activation status output for ADC 12, and output circuit 44 is configured to toggle the output activation status output during clock cycles in which the digital data output is activated, and to maintain a substantially constant output activation status output during clock cycles in which the digital data output is deactivated.

In some examples, ADC 12 includes an output strobe lead (e.g., STATUS lead 24) coupled to output circuit 44 and configured to output a strobe signal. In such examples, output circuit 44 is further configured to, when the digital output is activated, output one serial data output word per cycle of the strobe signal via the digital output lead.

In further examples, ADC 12 includes an output strobe lead (e.g., STATUS lead 24) coupled to output circuit 44 and configured to output a strobe signal. In such examples, output circuit 44 is further configured to, when the digital output is activated, output two serial data output words per cycle of the strobe signal via the digital output lead.

In additional examples, ADC 12 includes an output strobe lead (e.g., STATUS lead 24) coupled to output circuit 44. In such examples, the output strobe lead forms a strobe output for ADC 12, and output circuit 44 is configured to toggle the strobe output in response to the digital data output being activated, and to maintain a substantially constant strobe output in response to the digital data output being deactivated.

In some examples, the techniques of this disclosure may provide a novel, flexible, serial interface that allow high speed data transfer from high throughput data converters while reducing signal data integrity issues and reducing complexity of the board design as well as user-end logic.

One approach for transferring the conversion result of an ADC to a host controller is to use a parallel interface. However, a parallel interface may increase the cost of the overall solution, as it may need multiple pins on the device and host (thereby making the device and host larger) and may consume more real estate in terms of board design.

A serial interface may need a lesser number of pins but the host controller may need to provide a serial clock to read the data from the device at the rate of 1 bit per clock. The frequency of this clock may increase as the data transfer window (time period allotted for the data transfer) becomes narrow and/or as the number of data bits to be transferred increases.

As the data converters are reaching higher and higher throughputs at higher and higher resolutions, the data transfer window is shrinking and at the same time, the number of data bits is increasing. High speed data transfer clock requirements may pose multiple challenges in system level design.

For example, high speed data transfer clock requirements may limit the choice of host controllers. For example, a relatively small number of host controllers (e.g., high-end field-programmable gate arrays (FPGAs)) may be able to support serial clock speeds of greater than 100 megahertz (MHz). Host controllers that provide higher speed clocks may consume greater amounts power and may incur higher costs. To support high speed clocks, an ADC may have to operate at lower and lower IO supply voltages—further limiting the choice of host controllers.

Any component between the ADC and the host controller (e.g., a digital buffer or a digital isolator) may also have to be rated for same clock speed and input/output (I/O) levels. For a system using multiple ADCs connected in a star topology, the capacitive load on the output pins may increase significantly, thereby making it more and more difficult to run the interface at higher clock speeds and at lower power.

High speed data transfer clock requirements may cause difficulties in maintaining signal integrity, as controlled trace impedances may be required to avoid reflections. High speed data transfer clock requirements may cause further difficulties in timing closure at host end. For example, even if signal integrity can be maintained, the round trip delay between the device and host may become a critical parameter in determining the max serial clock (SCLK) speed. This problem may become worse when isolators are involved, causing a significant reduction in SCLK rates.

To increase performance, a high speed high precision data convertor may require a quiet conversion time and a quiet acquisition time (e.g., no digital activity should occur). The host controller may be expected to stop the clock during such quiet time zones. The relative position of such quiet zones with respect to data transfer may further complicate the host controller firmware.

In some examples, the techniques of this disclosure may support multiple serial interface protocols and allow a user to select a protocol based on their requirements. The protocols described in this disclosure may reduce clock speed requirements and/or associated host complexity.

One way to reduce the transfer clock speeds (without increasing the pin count) is to transmit the data with one cycle latency (i.e. during the next conversion). However, the data transmission may need to stop during the quiet conversion time. Any digital activity (especially on the serial data output (SDO) pins) during the quiet conversion time may corrupt the output of the ongoing conversion.

While the host may be able to stop the clock to ensure that the SDO activity freezes during the quiet conversion zone, this may complicate the logic in the host in following way. Assume there are M total bits to be transmitted. The host may start the clock and transfer x bits of data before the start of quiet conversion time. The host may go silent (i.e., stop the clock) during the quiet conversion time to ensure SDO does not toggle. After the quiet conversion time elapses, the host may restart the clock and transfer the remaining y bits, such that (x+y=M). As the clock rates may change from one application condition to the next, the host logic may need to compute a new combination x' and y', such that (x'+y'=M).

In some examples, the techniques of this disclosure may reduce and/or eliminate the above complexity issue by using a Valid mode protocol. The Valid mode protocol may be an ADC-controlled mode of data transfer where the burden of freezing SDO activity during the quiet conversion time is handled by the ADC allowing the host to simply provide a free running clock. In some examples, the same pin that reflects the READY state of the conversion may be re-used as the VALID pin, thereby avoiding an extra pin.

In some examples, an ADC may transfer two bits or serial data output words per clock cycle, thereby reducing the number of clock cycles required to complete the data transfer by two times. Therefore, for the same data transfer window, the clock speed requirement may be reduced by two times.

In further examples, an ADC may support an option of widening the SDO bus from 1-bit to 2-bits or 4-bits. In other words, an ADC may include multiple serial data output pins that are configurable to be individually activated and deactivated to provide serial data outputs of varying widths. Users may trade-off one (or three) extra digital pin(s) for a two times (or four times) reduction in clock speed requirement.

In some examples, an ADC may output the data as well as the strobe (clock). This approach may reduce and/or eliminate routing and internal device delays from having an impact on the overall transmit clock speed, particularly if the host is able to reliably delay the strobe to the middle of the data eye. This may aid timing closure and board design as well as reduce signal data integrity issues at high clock speeds.

In examples where the ADC provides a strobe, the ADC may, in some examples, shut off bit strobes (clocks) during the quiet conversion time, thereby allowing the host to implement a simple capture buffer where the SDO and clock are sourced from the ADC are directly fed into the buffer. The complexity of controlling when the SDO and associated clocks are active may be handled by the ADC.

The device output clock for the strobe signal may be generated from multiple sources including: (1) an external clock (e.g., host clock) that is echoed back by the ADC; and (2) an internal oscillator clock. The internal oscillator clock may reduce and/or eliminate the need of an external clock for data transfer. Further, the internal oscillator may be divided down by two times or four times to reduce the clock frequency. The same pin that reflects the READY state of the conversion may be re-used as the STROBE (clock) pin, thereby avoiding the need for an extra pin.

For timing closure on first bring-up, the ADC may, in some example, provide fixed value output patterns (e.g., all 0's, all 1's, alternating 0's and 1's, etc.) irrespective of the protocol selected. This allows for a quick bring-up and debug of the host-device interaction.

As discussed above, the ADC may, in some examples, generate a separate VALID output signal along with the data output(s). This may allow the host controller to provide a continuous clock—even during the quiet conversion time. Internally, during the quiet conversion time, the device may gate the clock on the device boundary and may not toggle the VALID output. Once the quiet conversion time elapses, the ADC may allow the clock to come in and VALID output and data output(s) may start toggling on every active clock edge.

At the host site, any data bit may be validated if there is a corresponding transition on VALID output. Otherwise, the data bit may not be validated. The ADC may stop toggling the VALID output as soon as all the data bits have been transmitted. The VALID mode may also operate on internal oscillator clock, thereby further reducing the synchronization requirements. The same pin that reflects the READY state of the conversion is re-used as the VALID pin, thereby avoiding the need for an extra pin.

The proposed solution may give flexibility to users to trade off clock speeds for interface pins without compromising on data integrity. The strobe mode and the valid mode may ease printed circuit board (PCB) design, firmware design and timing closure for the host controller.

The techniques and circuitry described in this disclosure may, in some examples, be implemented on any combination of one or more integrated circuits or other devices. Although illustrative examples have been shown and described by way of example, a wide range of alternative examples are possible within the scope of the foregoing disclosure.

What is claimed is:

1. An analog-to-digital converter (ADC) comprising:
    an analog input lead;
    a digital output lead;
    a conversion circuit having an analog input coupled to the analog input lead, and a digital output;
    a quiet conversion time period determination circuit coupled to the conversion circuit, the quiet conversion time period determination circuit having a quiet conversion time period notification output; and
    an output circuit having a data input coupled to the digital output of the conversion circuit, a control input coupled to the quiet conversion time period notification output of the quiet conversion time period determination circuit, and a data output coupled to the digital output lead.

2. The ADC of claim 1, wherein the digital output lead forms a digital output for the ADC, and wherein the output circuit is configured to selectively activate and deactivate the digital output based on whether the ADC is operating in the quiet conversion time period.

3. The ADC of claim 2, further comprising:
    an input clock lead configured to receive a clock signal,
    wherein the output circuit is further configured to, when the digital output is activated, output one serial data output word per clock cycle of the clock signal via the digital output lead.

4. The ADC of claim 2, further comprising:
    an input clock lead configured to receive a clock signal,
    wherein the output circuit is further configured to, when the digital output is activated, output two serial data output words per clock cycle of the clock signal via the digital output lead.

5. The ADC of claim 2, further comprising:
    an output activation status lead coupled to the output circuit.

6. The ADC of claim 5, wherein the output activation status lead forms an output activation status output for the ADC, and wherein the output circuit is configured to toggle the output activation status output during clock cycles in which the digital output is activated, and to maintain a substantially constant output activation status output during clock cycles in which the digital output is deactivated.

7. The ADC of claim 2, further comprising:
    an output strobe lead coupled to the output circuit and configured to output a strobe signal,
    wherein the output circuit is further configured to, when the digital output is activated, output one serial data output word per cycle of the strobe signal via the digital output lead.

8. The ADC of claim 2, further comprising:
    an output strobe lead coupled to the output circuit and configured to output a strobe signal,
    wherein the output circuit is further configured to, when the digital output is activated, output two serial data output words per cycle of the strobe signal via the digital output lead.

9. The ADC of claim 2, further comprising:
    an output strobe lead coupled to the output circuit.

10. The ADC of claim 9, wherein the output strobe lead forms a strobe output for the ADC, and wherein the output circuit is configured to toggle the strobe output in response to the digital output being activated, and to maintain a substantially constant strobe output in response to the digital output being deactivated.

11. A method comprising:
    selectively activating and deactivating, with an analog-to-digital converter (ADC), a digital data output of the ADC based on whether the ADC is operating in a quiet conversion time period.

12. The method of claim 11, wherein selectively activating and deactivating the digital data output includes:
    determining whether the ADC is operating in the quiet conversion time period;

deactivating the digital data output in response to determining that the ADC is operating in the quiet conversion time period; and activating the digital data output in response to determining that the ADC is not operating in the quiet conversion time period.

13. The method of claim 12, wherein determining whether the ADC is operating in the quiet conversion time period includes:

determining that the ADC is operating in the quiet conversion time period in response to determining that a threshold amount of time has elapsed since a start of a conversion of an analog sample and that the ADC has not finished the conversion of the analog sample; and determining that the ADC is not operating in the quiet conversion time period in response to determining that the threshold amount of time has not elapsed since the start of the conversion of the analog sample.

14. The method of claim 12, wherein determining whether the ADC is operating in the quiet conversion time period includes:

determining that the ADC is operating in the quiet conversion time period in response to determining that a threshold number of digital bits have been generated for an analog sample since a start of a conversion of the analog sample and that the ADC has not finished the conversion of the analog sample; and determining that the ADC is not operating in the quiet conversion time period in response to determining that the threshold number of digital bits has not been generated for the analog sample since the start of the conversion of the analog sample.

15. The method of claim 12, wherein determining whether the ADC is operating in the quiet conversion time period includes:

determining that the ADC is operating in the quiet conversion time period in response to determining that the ADC is currently generating bits for an analog sample that have bit significances that are lower than a threshold bit significance; and determining that the ADC is not operating in the quiet conversion time period in response to determining that the ADC is currently generating bits for the analog sample that have bit significances that are greater than the threshold bit significance.

16. The method of claim 11, further comprising:
converting a first analog sample into a first digital data word;
converting a second analog sample into a second digital data word;
acquiring a third analog sample for conversion into a third digital data word;
during conversion of the second analog sample into the second digital data word and during acquisition of the third analog sample, sequentially outputting groups of one or more bits of the first digital data word;
during conversion of the second analog sample into the second digital data word, determining whether the ADC is operating in a quiet conversion time period;
wherein selectively activating and deactivating the digital data output includes, during the conversion of the second analog sample into the second digital data word, deactivating the digital data output in response to determining that the ADC is operating in the quiet conversion time period.

17. The method of claim 11, further comprising:
toggling an output strobe signal once per serial data output word that is output by the digital data output.

18. The method of claim 11, further comprising:
toggling an output strobe signal twice per serial data output word that is output by the digital data output.

19. The method of claim 11, further comprising:
activating toggling of an output strobe signal in response to activation of the digital data output;
deactivating the toggling of the output strobe signal in response to deactivation of the digital data output;
toggling the output strobe signal one or more times per serial data output word that is output by the digital data output in response to activating the output strobe signal; and
maintaining a substantially constant value for the output strobe signal in response to deactivating the output strobe signal.

20. The method of claim 11, further comprising:
receiving a clock signal from an external device;
outputting one serial data output word per clock cycle of the clock signal in response to activation of the digital data output; and
toggling an output status signal once per clock cycle of the clock signal in response to outputting a serial data output word during the clock cycle.

21. The method of claim 11, further comprising:
receiving a clock signal from an external device;
outputting two serial data output words per clock cycle of the clock signal in response to activation of the digital data output; and
toggling an output status signal once per clock cycle of the clock signal in response to activation of the digital data output.

22. The method of claim 11, further comprising:
receiving a clock signal from an external device;
outputting one or more serial data output words during a clock cycle of the clock signal in response to the digital data output being activated during the clock cycle;
toggling an output status signal during a clock cycle of the clock signal in response to outputting the serial data output words during the clock cycle; and
maintaining a substantially constant value for the output status signal in response to the digital data output being deactivated during the clock cycle.

23. A device comprising circuitry configured to:
convert a first analog sample into a first digital data word;
convert a second analog sample into a second digital data word;
acquire a third analog sample for conversion into a third digital data word;
during conversion of the second analog sample into the second digital data word and during acquisition of the third analog sample, sequentially output groups of one or more bits of the first digital data word;
during conversion of the second analog sample into the second digital data word, determine whether the ADC is operating in a quiet conversion time period;
deactivate the digital data output in response to determining that the ADC is operating in the quiet conversion time period.

24. The device of claim 23, wherein the circuitry is further configured to:
activate the digital data output in response to determining that the ADC is not operating in the quiet conversion time period.

* * * * *